United States Patent
Lv et al.

(10) Patent No.: US 10,323,348 B2
(45) Date of Patent: Jun. 18, 2019

(54) SUSPENDER DISENGAGEMENT DETECTION APPARATUS FOR WASHING MACHINE AND SAFE OPERATION METHOD FOR WASHING MACHINE

(71) Applicant: QINGDAO HAIER WASHING MACHINE CO., LTD., Qingdao, Shandong (CN)

(72) Inventors: Peishi Lv, Qingdao (CN); Sheng Xu, Qingdao (CN); Yanfen Lv, Qingdao (CN); Xiuwen Peng, Qingdao (CN)

(73) Assignee: QINGDAO HAIER WASHING MACHINE CO., LTD., Shandong (CN)

( * ) Notice: Subject to any disclaimer, the term of this patent is extended or adjusted under 35 U.S.C. 154(b) by 82 days.

(21) Appl. No.: 15/507,058

(22) PCT Filed: Nov. 14, 2014

(86) PCT No.: PCT/CN2014/091141
§ 371 (c)(1),
(2) Date: Feb. 27, 2017

(87) PCT Pub. No.: WO2016/029559
PCT Pub. Date: Mar. 3, 2016

(65) Prior Publication Data
US 2017/0284006 A1 Oct. 5, 2017

(30) Foreign Application Priority Data
Aug. 29, 2014 (CN) .......................... 2014 1 0437986

(51) Int. Cl.
*D06F 33/02* (2006.01)
*D06F 37/20* (2006.01)
(Continued)

(52) U.S. Cl.
CPC .............. *D06F 33/02* (2013.01); *D06F 35/00* (2013.01); *D06F 37/203* (2013.01); *G01L 23/02* (2013.01); *G01R 31/343* (2013.01)

(58) Field of Classification Search
CPC ........ D06F 37/20; D06F 37/24; D06F 37/203; D06F 33/02; D06F 35/00
See application file for complete search history.

(56) References Cited

U.S. PATENT DOCUMENTS 5,375,437 A * 12/1994 Dausch ................. D06F 37/203
192/136
6,065,170 A * 5/2000 Jang ...................... D06F 37/203
68/12.04
(Continued)

FOREIGN PATENT DOCUMENTS

CN 2680704 Y 2/2005
CN 102733142 A 10/2012
(Continued)

OTHER PUBLICATIONS

Machine translation of JP 2000-342886 A to SANYO. (Year: 2000).*
(Continued)

*Primary Examiner* — Joseph L. Perrin
(74) *Attorney, Agent, or Firm* — Buchanan Ingersoll & Rooney PC

(57) ABSTRACT

A suspender disengagement detection apparatus for a washing machine, comprising pressure sensors and a controller. The pressure sensors are electrically connected to the controller. The controller is electrically connected to a drive motor of the washing machine. In a working process of the washing machine, the pressure sensors are mounted on the joint of at least one suspender and the housing of the washing machine, and/or the joint of the suspender and the suspender base of the outer tub of the washing machine to (Continued)

detect a pressure, and a detection result is fed back to the controller; and the controller determines, whether a suspender is disengaged according to feedback information, and further controls the change in a working state of the drive motor of the washing machine.

13 Claims, 1 Drawing Sheet

(51) Int. Cl.
*D06F 35/00* (2006.01)
*G01L 23/02* (2006.01)
*G01R 31/34* (2006.01)

(56) References Cited

U.S. PATENT DOCUMENTS

| | | | | |
|---|---|---|---|---|
| 6,460,381 | B1* | 10/2002 | Yoshida | D06F 37/203 68/12.04 |
| 6,983,657 | B1* | 1/2006 | Kakutani | D06F 37/24 73/779 |
| 2012/0060299 | A1* | 3/2012 | Kim | D06F 39/003 8/137 |
| 2015/0267339 | A1* | 9/2015 | Schenkl | D06F 33/02 68/12.04 |

FOREIGN PATENT DOCUMENTS

| | | | | |
|---|---|---|---|---|
| CN | 202671889 U | | 1/2013 | |
| CN | 103628277 A | | 3/2014 | |
| JP | 2000345886 A | * | 12/2000 | ........... F02D 41/023 |

OTHER PUBLICATIONS

International Search Report (PCT/ISA/210) dated Jun. 9, 2015, by the State Intellectual Property Office of the P.R. China as the International Searching Authority for International Application No. PCT/CN2014/091141.

Written Opinion (PCT/ISA/237) dated Jun. 9, 2015, by the State Intellectual Property Office of the P.R. China as the International Searching Authority for International Application No. PCT/CN2014/091141.

* cited by examiner

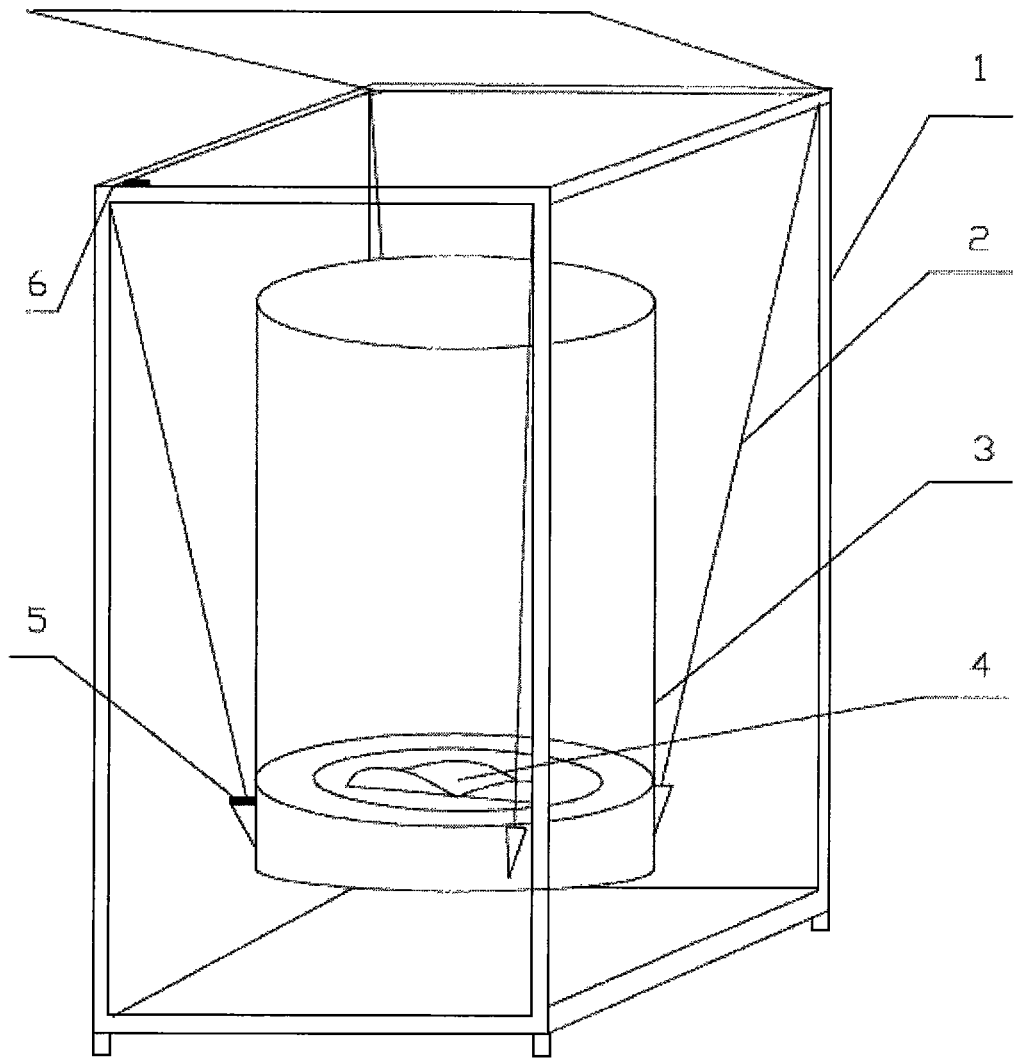

SUSPENDER DISENGAGEMENT DETECTION APPARATUS FOR WASHING MACHINE AND SAFE OPERATION METHOD FOR WASHING MACHINE

FIELD OF THE INVENTION

The present disclosure relates to a detection apparatus and a detection method, particularly to a suspender disengagement detection apparatus and a detection method for a washing machine, which belongs to a field of detection apparatus and detection method for a washing machine.

BACKGROUND OF THE INVENTION

An inner tub of a washing machine is arranged inside an outer tub, the inner tub and the outer tub are both arranged inside a housing and the outer tub is hung by a plurality of suspenders inside the housing, that is, one end of each suspender is connected to the housing and the other end is connected to the outer tub. However, the inner tub and the outer tub will vibrate due to the rotation of the inner tub during the working period of the washing machine. So the suspenders have a possibility to disengage with the housing or the outer tub, but the users may not aware the disengagement of the suspender in time, it will cause further damage to the washing machine as the washing machine continuing working.

In view of the foregoing, the present disclosure is proposed.

SUMMARY OF THE INVENTION

The technical problem need to be solved in the present disclosure is to overcome the shortcomings of the prior art, and provides a suspender disengagement detection apparatus and a detection method for a washing machine which can detect the suspender disengagement in time and make the washing machine stop working. It prevents further damage to the washing machine.

In order to solve the above described problem, the basic idea of the technical scheme adopted by the present disclosure is:

A suspender disengagement detection apparatus for a washing machine, of which an outer tub is connected to a housing of the washing machine through a plurality of suspenders. The suspender disengagement detection apparatus comprises a controller and at least one pressure sensor, the pressure sensor is arranged at a joint of at least one suspender and the housing of the washing machine and/or a joint of the suspender and a suspender base of the outer tub of the washing machine. The pressure sensor is electrically connected with the controller, and the controller is electrically connected to a driving motor of the washing machine.

Further, the joint of the suspenders and the housing of the washing machine and/or the joint of the suspenders and the suspender bases of the outer tub of the washing machine are all provided with pressure sensors.

Or, the outer tub is hung in the housing through four suspenders that are evenly distributed around the outer tub inside the housing of the washing machine. Pressure sensor is arranged at the joint of one of the suspenders and the housing of the washing machine and/or the joint of the suspender and the suspender base of the outer tub of the washing machine.

Further, the washing machine further comprises an alarm, and the alarm is electrically connected with the controller.

A safe operation method for a washing machine of the present disclosure comprises, during the working process of the washing machine, performing a pressure detection by providing with a pressure sensor at the joint of at least one suspender and the housing of the washing machine and/or the joint of the suspender and the suspender base of the outer tub of the washing machine, and feeding a test result back to the controller. The controller determines whether the suspender is disengaged or not according to the feedback information, which further controls the drive motor to change its working state.

It is determined whether the suspender is disengaged or not through analyzing whether a pressure value that the pressure sensor holds is beyond its normal pressure range or not.

During a washing and rinsing process, a pressure detection is run before the drive motor operates every time and a detection value is M. During the motor operation, a pressure value is detected several times in succession and the detected value is compared with M. If the detected value is within a setting range, it is determined that the suspender is normal. If the detected value is beyond the setting range, it is determined that the suspender is disengaged and the controller controls the drive motor of the washing machine to stop working.

During a dewatering process, first a pressure detection is run and the detection value is N. After a setting time, another pressure detection is run, the detection value is N1. Comparing two consecutive detection values, if a ratio is within a setting range, it is determined that the suspender is normal. If the ratio is beyond the setting range, it is determined that the suspender is disengaged and the controller controls the drive motor of the washing machine to stop working. Comparing a last detection value with a present detection value using a setting time as a detection period, it is determined whether the suspender is disengaged or not by determining the ratio is within the setting range or not.

The pressure sensor is arranged at the joint of one suspender and the housing of the washing machine and/or the joint of the suspender and the suspender base of the outer tub of the washing machine are respectively. And if the pressure value detected at any one pressure sensor or at all pressure sensors is beyond a normal pressure range, the controller determines that the suspender is disengaged and further controls the drive motor of the washing machine to stop working.

The joint of the suspenders and the housing of the washing machine and/or the joint of the suspenders and the suspender bases of the outer tub of the washing machine are all provided with pressure sensors. And if the pressure value detected by any one pressure sensor or the pressure values detected by any two or several pressure sensors are all beyond the normal pressure range, the controller determines that the suspender is disengaged and further controls the drive motor of the washing machine to stop working.

When the controller determines the suspender to be disengaged, it notices users through an alarm.

By adopting the technical scheme mentioned above, the present disclosure has the following advantageous effects as compared with the prior art.

A suspender disengagement detection apparatus for a washing machine of the present disclosure comprises a pressure sensor and a controller. At least one of two joints, which are a joint of at least one of a plurality of suspenders and a housing of the washing machine, and a joint of the suspender and a suspender base of the housing of the washing machine, is provided with the pressure sensor. The pressure sensor is electrically connected with the controller. The pressure sensor detects a corresponding pressure, the controller determines whether the suspender is disengaged or not according to a detection result and further controls a drive motor of the washing machine to change its working state.

In the safe operation method for the washing machine of the present disclosure, during a working process of the washing machine, the pressure detection is performed by providing with pressure sensor at the joint of at least one suspender and the housing of the washing machine and/or the joint of the suspender and the suspender base of the outer tub of the washing machine and feeds a test result back to the controller. The controller determines whether the suspender is disengaged or not according to the feedback information, which further to determine whether or not to send a signal of stopping working to the drive motor of the washing machine. It can effectively detect the suspender disengagement in the washing machine and stop working and alarm when the suspender disengagement is detected.

The following is further described in details with embodiments of the present disclosure.

BRIEF DESCRIPTION OF THE DRAWINGS

FIG. 1 is a mounting schematic view of a suspender disengagement detection apparatus for a washing machine in the washing machine of the present disclosure.

1. Housing 2. Suspender 3. Outer tub 4. Pulsator 5. Pressure sensor 6. Pressure sensor

DETAILED DESCRIPTION OF THE INVENTION

Embodiment 1

A suspender disengagement detection apparatus for a washing machine of the present disclosure comprises a pressure sensor and a controller. At least one of two joints, which are respectively a joint of at least one of a plurality of suspenders and a housing of the washing machine, and a joint of the suspender and a suspender base of an outer tub of the washing machine, is provided with the pressure sensor. The pressure sensor is electrically connected with the controller, the controller electrically connected with a drive motor.

In other embodiments, the joint of the suspenders and the housing of the washing machine and/or the joint of the suspenders and the suspender bases of the outer tub of the washing machine are all provided with pressure sensors. The pressure sensor is electrically connected with the controller, the controller electrically connected with the drive motor.

As shown in FIG. 1, in the present embodiment, the outer tub 3 is hung in the housing 1 through four suspenders 2 that are evenly distributed around the outer tub and inside the housing 1 of the washing machine. A pressure sensor 6 is arranged at the joint of one of the suspenders and the housing of the washing machine. A pressure sensor 5 is arranged at the joint of the suspender and the suspender base of the outer tub of the washing machine. The pressure sensors 5, 6 are both electrically connected with the controller, and the controller is electrically connected with the drive motor of the washing machine. The pressure sensors 5, 6 detect the corresponding pressures and feed the detection results back to the controller. The controller determines whether the suspender is disengaged or not according to the detection results and further controls the work and stop of the drive motor of the washing machine.

During the washing and rinsing process, a pressure detection is performed before the motor operates every time and the detection value is M. During the motor operation, a pressure value is detected several times in succession and the detected value is compared with M. If the detected value is within the range (0.9 M-1.1 M), it is determined that the suspender is normal. If the detected value is beyond the range (0.9 M-1.1 M), it is determined that the suspender is disengaged and the controller controls the drive motor of the washing machine to stop working. The detection frequency is a range from 100 Hz to 1000 Hz. The range (0.9 M-1.1 M) is not fixed which is different according to different washing method.

During the dewatering process, comparing a last detection value with a present detection value using a setting time as a detection period, it is determined whether the suspender is disengaged or not by determining a ratio is within the setting range or not. Specifically, first a pressure detection is run and the detection value is N. After a setting time, such from 1 to 5s, another pressure detection is run, the detection value is N1. Comparing the two consecutive detection values N1/N, if a ratio α is within a setting range from 0.9 to 1, it is determined that the suspender is normal. If the ratio is beyond the setting range, it is determined that the suspender is disengaged and the controller controls the drive motor of the washing machine to stop working. The range (0.9-1) is not fixed and the setting range is different according to different clothes and different dewatering rotational speed.

For the convenience of expression, if a pressure sensor is arranged at least one of positions which are respectively the joint of one suspender and the housing of the washing machine, the joint of the suspender and the outer tub of the washing machine, and the footing of the housing of the washing machine corresponding to the suspender. Then the suspender is expressed as the suspender with pressure sensor, otherwise, the suspender is expressed as the suspender without pressure sensor.

During the proper functioning of the washing machine, the outer tub 3 is provided with an inner tub, a pulsator 4 in the inner tub is driven to rotate by the drive motor, and the outer tub and the inner tub vibrate, so the pressure value on the pressure sensor is within a normal range. But once a suspender is disengaged, then the pressure on any one of the pressure sensor change. And the pressure value is not in the normal range. The normal range of the pressure value refers to the normal range of the pressure value detected by the pressure sensor when the suspender is connected with both the housing of the washing machine and the suspender base of the outer tub of the washing machine. The pressure sensor transmits the detection result to the controller, and the controller determines whether the suspender is disengaged or not according to the feedback information, thereby sends a signal to the drive motor of the washing machine to stop working.

Determining whether the suspender is disengaged or not according to the pressure on the pressure sensor is mainly realized based on the following situations.

When any one of the suspenders is disengaged, the outer tub and the inner tub are imbalanced due to lack one suspender to hang. So force taken by the left three suspenders is increased.

1. If the suspender disengaged is the suspender without pressure sensor, the pressure detected by the pressure sensor 6 which is arranged at the joint of an upper end of the other suspender and the housing of the washing machine is increased. And so the pressure detected by the pressure sensor 5 which is arranged at the joint of a lower end of the other suspender and the suspender base of the outer tub of the washing machine is increased.

If any one of the pressures detected by the pressure sensors mentioned above is beyond the normal pressure value range, it can be determined that there is a suspender disengaged. In other embodiments, in order to determine more accurately, it can be determined that there is a suspender disengaged when pressures detected by the two pressure sensors are beyond the normal pressure value range.

2. If the suspender disengaged is the suspender with pressure sensor, the pressure detected by the pressure sensor 6 which is arranged at the joint of an upper end of the suspender and the housing of the washing machine is decreased to near zero. And so the pressure detected by the pressure sensor 5 which is arranged at the joint of a lower end of the suspender and the suspender base of the outer tub of the washing machine is also decreased to near zero.

If any one of the pressures detected by the pressure sensors mentioned above is beyond the normal pressure value range, it can be determined that there is a suspender disengaged. In other embodiments, in order to determine more accurately, it can be determined that there is a suspender disengaged when pressures detected by the two pressure sensors are all beyond the normal pressure value range. In the present embodiment, the upper and lower ends of the same suspender are respectively provided with a pressure sensor. It can also arrange only one pressure sensor at the joint of the upper end of the suspender and the housing of the washing machine or the joint of the lower end of the suspender and the suspender base of the outer tub of the washing machine.

Further, the suspender disengagement detection apparatus for the washing machine is also comprises an alarm, and the alarm is electrically connected with the controller. The alarm notices users when the controller determines the suspender to be disengaged.

Embodiment 2

A safe operation method for a washing machine comprises, during the working process of the washing machine, performing the pressure detection by providing with a pressure sensor at any one of positions which are the joint of the suspender and the housing of the washing machine, and the joint of the suspender and the suspender base of the outer tub of the washing machine and feeding a test result back to the controller. The controller determines whether the suspender is disengaged or not according to the feedback information, which further control the drive motor to change its working states.

During the washing and rinsing process, a pressure detection is performed before the motor operates every time and the detection value is M. During the motor operation, a pressure value is detected several times in succession and the detected value is compared with M. If the detected value is within the range (0.9 M-1.1 M), it is determined that the suspender is normal. If the detected value is beyond the range (0.9 M-1.1 M), it is determined that the suspender is disengaged and the controller controls the drive motor of the washing machine to stop working. The detection frequency is from 100 Hz to 1000 Hz. The range (0.9 M-1.1 M) is not fixed which is different according to different washing method.

During the dewatering process, comparing a last detection value with a present detection value using a setting time as a detection period, it is determined whether the suspender is disengaged or not by determining the ratio is within the setting range or not. Specifically, first a pressure detection is run and the detection value is N. After a setting time, such as 1 to 5 s, another pressure detection is run, the detection value is N1. Comparing the two consecutive detection values N1/N, if a ratio $\alpha$ is within a setting range from 0.9 to 1, it is determined that the suspender is normal. If the ratio is beyond the setting range, it is determined that the suspender is disengaged and the controller controls the drive motor of the washing machine to stop working. The range (0.9-1) is not fixed and the setting range is different according to different clothes and different dewatering rotational speed.

The outer tub is hung though a plurality of suspenders in the housing. The outer tub is usually hung through four suspenders which are evenly distributed around the periphery of the outer tub. A pressure sensor is arranged at the joint of the upper end of the suspender and the housing of the washing machine, and the suspender acts a pressure on the joint and transmits to the pressure sensor.

The lower end of the suspender is connected to the outer tub, the joint of the end of the suspender and the suspender base of the outer tub of the washing machine is provided with the pressure sensor, the suspender acts a pressure to the joint and transmits to the pressure sensor.

During the proper functioning of the washing machine, the outer tub and the inner tub vibrate, so the pressure values on the three pressure sensors mentioned above are within a normal range. But once a suspender is disengaged, then the pressure on any one of the pressure sensor changes, so the pressure value is not in the normal range. The pressure sensor sends the detection result to the controller, and the controller determines whether the suspender is disengaged or not according to the feedback information, thereby sends a signal to the drive motor of the washing machine to stop working.

Determining whether the suspender is disengaged or not according to the pressure on the pressure sensor is mainly realized based on the following situations.

When any one of the suspenders is disengaged, the outer tub and the inner tub are imbalanced due to lack one suspender to hang. So force taken by the left three suspenders is increased.

1. If the suspender disengaged is the suspender without pressure sensor, the pressure detected by the pressure sensor which is arranged at the joint of an upper end of the other suspender and the housing of the washing machine is increased. And so the pressure detected by the pressure sensor which is arranged at the joint of a lower end of the other suspender and the suspender base of the outer tub of the washing machine is increased.

If any one of the pressures detected by the pressure sensors mentioned above is beyond the normal pressure value range, it can be determined that there is a suspender disengaged. In other embodiments, in order to determine more accurately, it can be determined that there is a suspender disengaged when pressures detected by the two pressure sensors are all beyond the normal pressure value range.

2. If the suspender disengaged is the suspender with pressure sensor, the pressure detected by the pressure sensor which is arranged at the joint of an upper end of the suspender and the housing of the washing machine is decreased to near zero. And so the pressure detected by the pressure sensor which is arranged at the joint of a lower end of the suspender and the suspender base of the outer tub of the washing machine is also decreased to near zero.

If any one of the pressures detected by the pressure sensors mentioned above is beyond the normal pressure value range, it can be determined that there is a suspender disengaged. In other embodiments, in order to determine more accurately, it can be determined that there is a suspender disengaged when pressures detected by the two pressure sensors are all beyond the normal pressure value range.

In other embodiments, it can arrange pressure sensors at the joints of all four suspenders and the housing of the washing machine and/or the joints of the suspenders and the suspender bases of the outer tub of the washing machine, and the pressure sensors are electrically connected with the controller, which can make the detection result more accurate. Also, based on the demand of accuracy of the determination, when the pressure value detected by the pressure sensor at any place is beyond the normal pressure value range, or the pressure values detected by any two or several pressure sensors are all beyond the normal pressure value range, the controller determines that the suspender is disengaged and further controls the drive motor of the washing machine to stop working.

A safe operation method for a washing machine of the present disclosure, can effectively detect the suspender disengagement in the washing machine and let the drive motor of the washing machine stop and alarm when the suspender is disengaged.

The implementation solutions in the above embodiments can be further combined or replaced, and the embodiments merely describe preferred embodiments of the present invention, instead of limiting the concept and the scope of the present invention; without departing from the design concept of the present invention, various variations and improvements made to the technical solutions of the present invention by persons skilled in the art all belong to the protection scope of the present invention.

The invention claimed is:

1. A safe operation method for a washing machine, during a working process of the washing machine, the washing machine including
    a pressure sensor located at a first joint of a suspender and a housing of the washing machine or a pressure sensor located at a second joint of the suspender and a suspender base of an outer tub of the washing machine, or a pressure sensor located at both the first joint and the second joint, and a controller configured to:
    receive a detection result detected by each pressure sensor; and
    determine whether the suspender is disengaged according to the detection results, wherein
    if a pressure value detected at any one pressure sensor is beyond a predetermined pressure range, the controller is configured to determine that the suspender is disengaged and control the drive motor of the washing machine to stop working.

2. The safe operation method for the washing machine according to claim 1, wherein during a washing and rinsing process, the controller is configured to receive a detection result of each pressure sensor before the drive motor operates every time and a detection value is M,
    during a motor operation, the controller is configured to receive a detection result of each pressure sensor several times in succession and each detected pressure value is compared with M, wherein
    if the detected pressure values are within a set range relative to M, the controller is configured to determine that the suspender is normal, and
    if the detected pressure values are beyond the set range relative to M, the controller is configured to determine that the suspender is disengaged and control the drive motor of the washing machine to stop working.

3. The safe operation method for the washing machine according to claim 2, wherein
    during a dewatering process, the controller is configured to receive a first detection result of each pressure sensor and a first detected pressure value is N,
    after a set time, the controller is configured to receive a second detection result of each pressure sensor and a second detected pressure value is N1, and
    the controller is configured to compare two consecutive detection values, and if a ratio of N/N1 is within a set range, determine that the suspender is normal, and
    if the ratio N/N1 is beyond the set range, the controller is configured to determine that the suspender is disengaged and control the drive motor of the washing machine to stop working.

4. The safe operation method for the washing machine according to claim 2, wherein the washing machine includes a plurality of suspenders and first joints of the suspenders and the housing of the washing machine or second joints of the suspenders and the suspender bases of the outer tub of the washing machine, or both the first joints and the second joints are all provided with pressure sensors, wherein the controller is configured to receive a detection result of each pressure sensor,
    and if the pressure value detected by at least two pressure sensors are beyond the predetermined pressure range, the controller is configured to determine that the suspender is disengaged and control the drive motor of the washing machine to stop working.

5. A safe operation method for a washing machine according to claim 2, wherein the set range is 0.9 M-1.1 M.

6. The safe operation method for the washing machine according to claim 1, wherein
    during a dewatering process, the controller is configured to receive a first detection result of each pressure sensor and a first detected pressure value is N,
    after a set time, the controller is configured to receive a second detection result of each pressure sensor and a second detected pressure value is N1, and
    the controller is configured to compare two consecutive detection values, and if a ratio of N/N1 is within a set range, determine that the suspender is normal, and
    if the ratio N/N1 is beyond the set range, the controller is configured to determine that the suspender is disengaged and control the drive motor of the washing machine to stop working.

7. A safe operation method for a washing machine according to claim 6, wherein the set range of the ratio N/N1 is 0.9-1.

8. The safe operation method for the washing machine according to claim 1, wherein the washing machine includes a plurality of suspenders and first joints of the suspenders and the housing of the washing machine or second joints of the suspenders and the suspender bases of the outer tub of the washing machine, or both the first joints and the second joints are all provided with pressure sensors, wherein the controller is configured to receive a detection result of each pressure sensor,
    and if the pressure value detected by at least two pressure sensors are beyond the predetermined pressure range, the controller is configured to determine that the suspender is disengaged and control the drive motor of the washing machine to stop working.

9. The safe operation method for the washing machine according to claim 1, wherein when the controller determines the suspender to be disengaged, is configured to notify users through an alarm.

10. A safe operation method for a washing machine, during a working process of the washing machine, the washing machine including a pressure sensor located at a first joint of a suspender and a housing of the washing machine or a pressure sensor located at a second joint of the suspender and a suspender base of an outer tub of the washing machine, or a pressure sensor located at both the first joint and the second joint, and a controller configured to:

receive a detection result of each pressure sensor before the drive motor operates every time and a detection value is M; and during a motor operation, receive a detection result of each pressure sensor several times in succession and compare a detected pressure value with M, wherein if the detected pressure values are within a set range relative to M, the controller is configured to determine that the suspender is normal, and if the detected pressure values are beyond the set range relative to M, determine that the suspender is disengaged and control the drive motor of the washing machine to stop working.

11. A safe operation method for a washing machine according to claim 10, wherein the the set range is 0.9 M-1.1 M.

12. A safe operation method for a washing machine, during a working process of the washing machine, the washing machine including a pressure sensor located at a first joint of a suspender and a housing of the washing machine or a pressure sensor located at a second joint of the suspender and a suspender base of an outer tub of the washing machine, or a pressure sensor located at both the first joint and the second joint, and a controller configured to:

during a dewatering process, receive a first detection result of each pressure sensor and a first detected pressure value is N;

after a set time, receive a second detection result of each pressure sensor and a second detected pressure value is N1;

compare two consecutive detection values, and if a ratio of N/N1 is within a set range, determine that the suspender is normal; and if the ratio N/N1 is beyond the set range, determine that the suspender is disengaged and control the drive motor of the washing machine to stop working.

13. A safe operation method for a washing machine according to claim 12, wherein the set range of the ratio N/N1 is 0.9-1.

* * * * *